United States Patent [19]

Chen

[11] Patent Number: 5,586,128
[45] Date of Patent: Dec. 17, 1996

[54] SYSTEM FOR DECODING DIGITAL DATA USING A VARIABLE DECISION DEPTH

[75] Inventor: Jyun-cheng Chen, Orange, N.C.

[73] Assignee: Ericsson GE Mobile Communications Inc., Research Triangle Park, N.C.

[21] Appl. No.: 343,925

[22] Filed: Nov. 17, 1994

[51] Int. Cl.⁶ ....................................... G06F 11/10
[52] U.S. Cl. .............................. 371/43; 375/341
[58] Field of Search .................. 371/30, 43–46; 375/340–342

[56] References Cited

U.S. PATENT DOCUMENTS

| | | |
|---|---|---|
| 3,789,359 | 1/1974 | Clark, Jr. et al. |
| 4,087,787 | 5/1978 | Acampora . |
| 4,583,078 | 4/1986 | Shenoy et al. |
| 4,833,693 | 5/1989 | Eyuboglu . |
| 4,868,830 | 9/1989 | Pollara-Bozzola . |
| 4,905,317 | 2/1990 | Suzuki et al. |
| 5,093,848 | 3/1992 | Raith . |
| 5,099,499 | 3/1992 | Hammer . |
| 5,136,616 | 8/1992 | Dent . |
| 5,150,381 | 9/1992 | Forney, Jr. et al. |
| 5,151,904 | 9/1992 | Reiner et al. ............... 371/43 |
| 5,164,961 | 11/1992 | Gudmundson . |
| 5,181,209 | 1/1993 | Hagenauer et al. |
| 5,191,598 | 3/1993 | Backstrom et al. |
| 5,202,903 | 4/1993 | Okanoue . |
| 5,204,878 | 4/1993 | Larsson . |
| 5,208,816 | 5/1993 | Seshardi et al. |
| 5,280,489 | 1/1994 | Fredrickson et al. ............ 371/45 |
| 5,341,387 | 8/1994 | Nguyen .................... 371/45 |

OTHER PUBLICATIONS

"The Viterbi Algorithm", G. David Forney, Jr., Proc. IEEE, vol. 61, pp. 268–278, Mar. 1973.

Primary Examiner—Roy Envall
Assistant Examiner—Thomas E. Brown
Attorney, Agent, or Firm—Nixon & Vanderhye P.C.

[57] ABSTRACT

In a digital data decoder such as a Viterbi algorithm decoder, digital data transmitted over a communications channel are estimated by a receiver using a variable decision depth technique to thereby improve bit error rate (BER) and channel estimation and to reduce decision delay. In the context of conventional trellis structures used for sequence estimation, the decoder assigns group flags to each state for each time interval being considered and stores those group flags along with corresponding accumulated path metrics associated with the states. More specifically, from a just decoded state, flags from different groups, e.g. each group representing a color, number, etc., are assigned to successor states connected by a survivor path to the just decoded state. Each offspring state of a parent state is assigned the parent's group flag. The decoder detects where in the trellis all of the survivor states have the same group flag. At this point where all the flags agree, the decoder back traces through the trellis to the parent state having that same group flag. That parent state is then decoded as the estimate of the symbol(s). Thereafter, group flags are reassigned and the procedure repeated using this newly decoded state as the new just decoded state.

16 Claims, 4 Drawing Sheets

SYSTEM FOR DECODING DIGITAL DATA USING A VARIABLE DECISION DEPTH

FIELD OF THE INVENTION

The present invention relates generally to decoding digital data received over a communications channel, and more particularly, to estimating received information based on a variable decision depth technique to improve bit error rate (BER) and channel estimation and to reduce decoding delay in a digital data decoder such as a Viterbi algorithm decoder.

BACKGROUND AND SUMMARY OF THE INVENTION

When the Viterbi algorithm was proposed in 1967, it was presented as a method of decoding convolutional codes. Since that time, it has been recognized as an attractive solution to a variety of digital estimation problems. One of the first explanations of the Viterbi algorithm is provided in the article "The Viterbi Algorithm," from the Proceedings of the IEEE, Volume 61, pages 268–278, March, 1973.

The Viterbi algorithm can be explained by simple analogy as a method for finding the shortest path between two points (or more generally "states"). Consider the exemplary "map" shown in FIG. 1. A plurality of points are variably spaced from each other. Individual numbers are associated with each line referred to as a branch connecting two points with that number representing distance between the two points. Many possible routes referred to as "paths" connecting various different intermediate points exist between point A and point B (and in fact the Viterbi algorithm used in practice often considers millions or trillions of possible paths).

The Viterbi algorithm starts from point A and assigns an initial accumulated "metric" of zero to node A and initially sets a time index n to zero. Metric corresponds in this example to distance but also represents more generally a weight or probability associated with a particular path. The Viterbi algorithm then 1. Determines all possible states (called successors) at time instance n+1 which are a one "branch" extension (a branch being a single segment connection between two states) from a "predecessor state" being considered at time n. In this example, point A at time n=0 is the predecessor state for states $A_1$, $A_2$, $A_3$ and $A_4$ at time n=1.

2. For each successor state, all paths (a path being a particular series of branches connecting a set of states) that lead or merge into that successor state are examined. In addition, a metric is calculated for each of those paths merging into that successor state. Each path metric equals the sum of an already accumulated path metric assigned to the predecessor state and the "branch metric" corresponding to the branch leading from the predecessor state to the successor state at time n. This step is often referred to as the "Add" step of the Viterbi algorithm.

3. Less "competitive" paths are eliminated with competitiveness being measured in terms of accumulated path metrics. Each path's metric is compared with the other competing path metrics until only the shortest path (called the "survivor") remains along with that successor's accumulated metric. This process includes two steps often referred as the "Compare" and "Select" steps of the Viterbi algorithm.

4. Steps 2 and 3, i.e., the Add, Compare, and Select steps, are repeated for all successor states.

5. Steps 1–4 are repeated for all states at time n and then the processor continues to the next time interval n+1.

Generally, if there is only one branch leading into a state, it is the survivor. If there is a tie when comparing path matrics, one of the paths is randomly selected.

Once a survivor path is chosen and the Viterbi algorithm is complete, the received information is estimated, i.e. decoded. Each state (or branch) along the chosen survivor corresponds to a particular symbol. Therefore, one symbol corresponding to the selected state is decoded for each time interval.

In essence, the Viterbi algorithm is an efficient way of sorting all possible paths between the beginning point A and the ending point B and selecting the best path. A fundamental principle of the algorithm is that the most likely path to be selected (i.e. survive) must at any time begin with one of the survivor states. Although this example of the Viterbi algorithm is described in terms of distance between two points, the Viterbi algorithm is applicable to all problems which can be described as a finite state machine, i.e. the number of possible events is finite when the "machine" transitions from one state to the next.

With even a relatively small number of possible states at any one time interval, visualizing the number of possible branch decisions from one state to another state for successive time intervals is a difficult task. Therefore, trellis diagrams are often used to illustrate the finite state machine with the dimension of time added to show a different version of the state diagram for each time interval. In practical applications, a trellis diagram is configured based on characteristics of the physical system from which state transitions are being predicted. Each column in the trellis represents the number of possible states 1, 2, 3, 4 . . . with each state representing (in the digital data communications context) one or more symbols. There is one column for each time interval (or index) 0, 1, 2, . . . .

In radio communication applications, for example mobile radio communications including both cellular and land mobile radio, the Viterbi algorithm is often employed to decode digital data in the context of convolutional codes, adaptive equalization, and demodulation of intersymbol interference (ISI) corrupted signals. In these exemplary radio communication applications, the Viterbi algorithm estimates as a received signal sequence R(n) the most likely transmitted signal sequence S(n) in the presence of quasi-predictable distortion sources on the communications channel C(n) and unpredictable noise sources N(n) corrupting the transmitted signal. The received signal therefore may be represented as follows: R(n)=S(n)C(n)+N(n). In this context, the Viterbi algorithm processes a block of received signal samples (which presumably have been modulated and/or coded in a transmitter), and chooses from the data received at a receiver a sequence of digital ones and zeroes that were most likely to have been transmitted.

The Viterbi algorithm is therefore generally characterized as a maximum likelihood sequence estimator (MLSE). Accordingly, the algorithm estimates/decides what sequence of ones and zeroes has been transmitted only after the entire logical sequence or block of received data being analyzed, e.g. a time slot of data in time division multiple access (TDMA) systems has been received and processed. Unfortunately, since a block of, for example, 160 symbols must be completely Viterbi analyzed before finalizing a decoded estimate of any one of the 160 symbols, there is a significant delay associated with this decision making process.

Such decision delay is undesirable in real time sequence estimation applications like mobile radio communications. For example, channel equalizers require intermediate updates of the channel characteristics C(n) in order to accurately estimate/predict those channel characteristics to reflect changes in the channel. On the other hand, the Viterbi algorithm is an MLSE, i.e., achieves the optimum performance, only when the decision depth is infinite. In practice, a decision depth of five to six times of the constraint length (memory) of the code may be used to achieve near-optimal sequence estimation.

But even such practical decision depths are unnecessarily long for certain sequence estimation applications. Consider an MLSE equalizer where a fixed decision depth D is chosen. At time n, the equalizer examines all survivors at time n-D (i.e. looking backward in time) and picks the survivor having the maximum metric. An intermediate decision resulting in one or more decoded bits corresponding to this maximum metric path at time n-D is sent back to a channel tracker. The channel tracker uses these decoded bits for time n-D to update the channel model estimate C(n) at time n. In other words, the channel tracker will not accurately predict the channel characteristic without some input regarding the sequence of symbols which have recently been decoded. Based on the signal block received and output by the updated channel tracker at time n, the Viterbi algorithm is then performed on all states at time n.

A problem arises that at time n, the Viterbi algorithm only produces a partial decode decision for decision time n-D. This decision at time n-D is then used to predict the channel at time n. If D is too large or the channel is varying quickly, i.e. a fast fading channel, the channel prediction becomes unreliable. Thus, there is trade off between accuracy of the ultimate sequence estimation (e.g., as measured by bit error rate (BER)) and the accuracy and stability of tracking the characteristics of a particular communications channel which in turn also affects BER. The choice of an appropriate decision depth D for various rates of fading is a compromise balance of bit error rate and the effectiveness of the channel tracking algorithm.

In a typical communications channel, (e.g. one based on a white Gaussian noise model), the difference in the metric associated between the selected path (the maximum metric) and other paths rises exponentially with time. In fact, for favorable communications conditions, the MSLE path selection process can operate effectively using a decision depth that is less that the fixed decision depth D. In contrast, fading communication channels may require longer time/decision depth to distinguish the maximum metric path from the other paths. A variable decision depth would provide a way to efficiently adapt to favorable and unfavorable channel conditions.

Accordingly, the present invention provides a variable decision depth sequence estimator which can be dynamically adapted to the changing characteristics of the communications channel/application. When the channel condition is favorable, possible survivor trellis paths associated with a current trellis stage being decoded typically converge before a maximum decision delay expires. With a maximum decision depth preset, early path convergence to a single survivor state is detected to provide current decoded symbols for updating the most recent channel predictions. When the survivor paths converge quickly, the present invention reduces the decision delay from the fixed delay. As a result, predicted channel estimation/tracking is improved because the prediction interval is shortened. Only when there are less favorable channel conditions, such as when shadowing or fading occur, would a unique survivor not exist at an earlier decision time. In that situation, a longer decision depth up to the maximum preset is employed. Therefore, the overall performance of an equalizer or the average delay of a decoder employing the technique of the present invention is improved over one using a fixed decision depth.

The decoder assigns group flags to each state for each time interval being considered and stores those group flags along with corresponding accumulated path metrics associated with each state. More specifically, from a just decoded state, flags from different groups, e.g. each group being represented by a color, a number, etc., are assigned to subsequent states connected by a survivor path to the just decoded state. Each offspring state of a parent state is assigned the parent's group flag. The decoder detects where in the trellis all of the survivor states have the same group flag. At this point where all the flags agree, the decoder back traces through the trellis to the parent state having that same group flag. That parent state is then decoded as the estimate of the symbol(s). Thereafter, group flags are reassigned and the procedure repeated using this newly decoded state as the new just decoded state.

These and other advantages and features of the present invention will become apparent from the following description of the preferred embodiments and from the claims.

DETAILED DESCRIPTION OF THE DRAWINGS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well known methods, devices and circuits are omitted so as to not obscure the description of the present invention with unnecessary detail. In addition, while the present invention is described in conjunction with the Viterbi algorithm, the present invention applies equally as well to other sequence estimation techniques.

Figure 1:
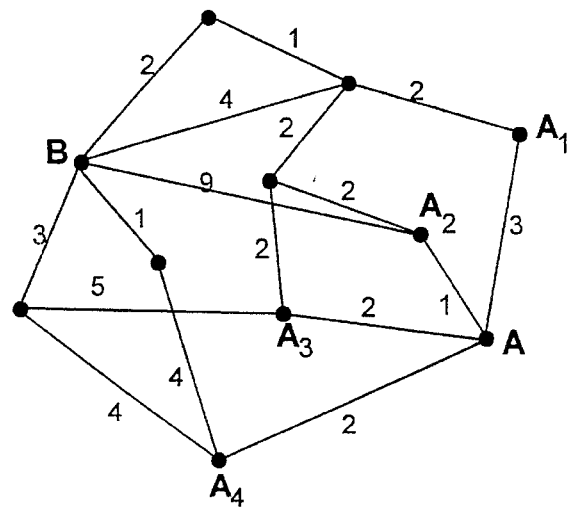
FIG. 1 is a sample state diagram.
Figure 2:
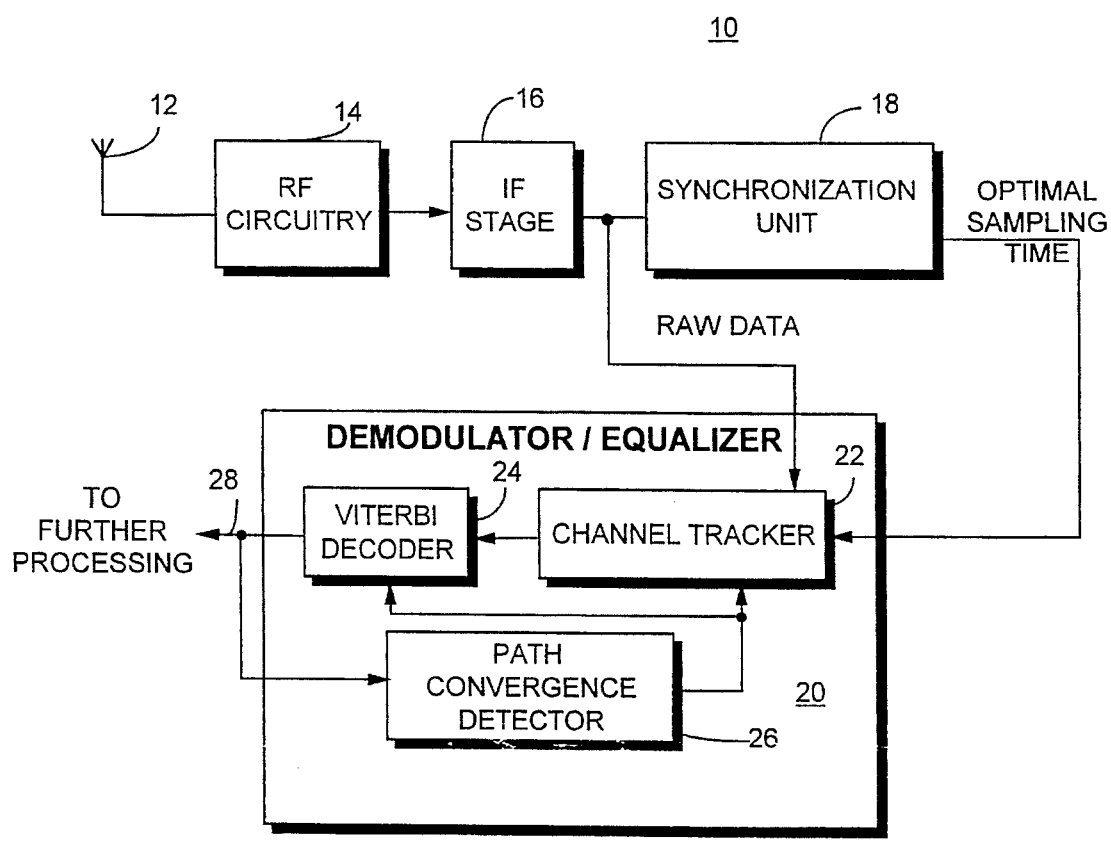
FIG. 2 is a functional block diagram illustrating the present invention in one preferred embodiment as a part of a radio receiver.
Figure 3:
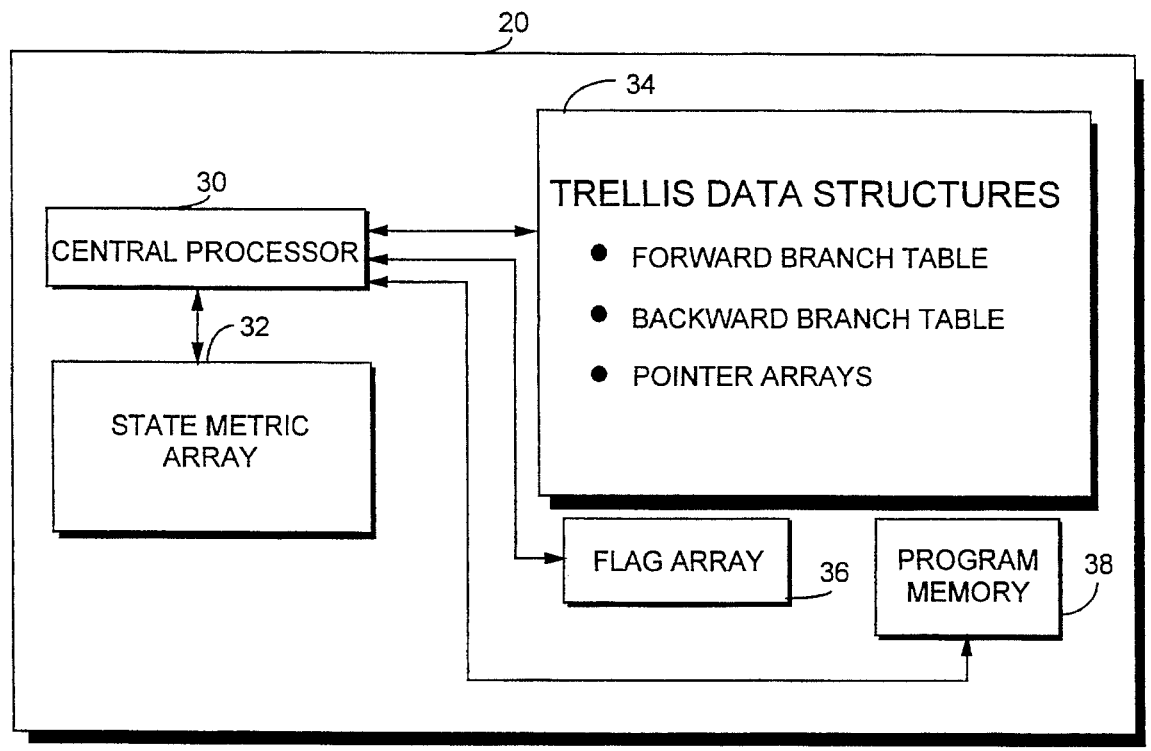
FIG. 3 is a function block diagram showing hardware and memory structures for implementing the demodulator/equalizer shown in FIG. 3.

FIG. 2 shows a receiver 10 in which the present invention may be employed. Although the present invention is described in terms of a radio receiver, those skilled in the art will appreciate that the present invention can be applied to communication systems that employ communications media other than radio frequency.

The receiver 10 may be incorporated for example in a time shared radio communications system used with mobile telephones communicating in the now well known time division multiple access (TDMA) type of system. In such a TDMA system, each communication channel is assigned a corresponding time slot during which a sequence of symbols is transmitted. Each time slot also conventionally includes a synchronizing sequence along with data sequences.

Often the transmitted data sequence carries information in the form of phase modulated binary digits. For example, some cellular telephone systems employ a π/4-differential quadrature phase shift keying (π/4-DQPSK) modulation scheme. For example, a vector V in an IQ complex plane is characterized by its amplitude and its phase. The vector rotates between four points A, B, C, and D located in each quadrant of the complex plane. Different symbols are represented using clockwise and counterclockwise vector rotations to those complex quadrant coordinates.

Prior to transmitting the information from a transmitter (not shown) channel coding, block coding, encryption/scrambling, and other kinds of information processing may be effected on the time slot sequence. When transmitted over an rf communications channel, the transmitted signal is subjected to interference and distortion (both amplitude and phase) from noise, multipath propagation, fading, etc. When the signal is received via the antenna 12 by conventional rf circuitry 14, it may be frequency down-converted to intermediate frequency (IF) band. IF stage 16 (such as a phase digitizer) converts the IF signal to baseband and performs analog to digital conversion. If IF stage 16 is a phase digitizer, quantitized eight bit values are generated to provide raw digitized data. A conventional synchronization unit 18 (e.g., a phase-locked loop) detects frame and bit synchronization bits in order to define frame, symbol, and bit timing information. The frame and bit synchronization signals along with the raw data from IF stage 16 are provided to a channel tracker 22 included in a demodulator/equalizer 20.

Channel tracker 22 models dynamically in time the phase and amplitude distortion C(n) combined with signals transmitted over the current communications channel. By way of simple filter analogy, the channel tracker acts as a time varying filter to "filter out" these phase and amplitude distortions added by the channel environment in order to output compensated raw data to a conventional Viterbi decoder 24. By tracking such channel distortions, the raw data can be coherently demodulated. The Viterbi decoder 24 produces an output signal 28 as a sequence of binary digits which is an estimate of the transmitted signal sequence. Signal 28 then may be further processed depending on the application and the signal/data processing carried out in the transmitter including for example speech decoding, convolutional decoding, block decoding, image processing, decryption, descrambling, etc.

Demodulator/equalizer 20 also includes a path convergence detector 26 which receives a feedback output from Viterbi decoder 24 and path convergence signals to the Viterbi decoder 24 and provides the channel tracker 22. The decoded bits output by the Viterbi decoder 24 and passed to the channel tracker 22 permit the channel tracker 22 to update the model C(n) of the communications channel, (C(n) being particularly susceptible to variance in relatively short time periods in mobile communications), and thereby more accurately compensate the received raw data for channel injected amplitude and phase distortions.

Although the demodulator/equalizer 20 is shown in FIG. 2 as being implemented by functional blocks 22, 24, and 26, the demodulator/equalizer 20 is implemented in the preferred embodiment using a suitably programmed digital signal processor (DSP) large scale integrated (LSI) circuit chip which includes both on-chip data processing capability and memory. Exemplary digital signal processors include the C50/C56 models available from Texas Instruments Inc. Of course those skilled in the art will recognize that the demodulator/equalizer 20 could be implemented using discrete hardwired logic circuits, ASICs, discrete off-chip memory and/or processing components, and any viable arrangement of data processing equipment/software algorithms for implementing the functions of the channel tracker, Viterbi decoder, and path convergence detector.

The central processor 30 is the primary data processing device which stores, accesses, and manipulates raw data at high speed in accordance with instructions stored in program memory 38. Central processor 30 is connected to various memory components including state metric array 32, trellis data structures 34, flag array 36, and program memory 38. Preferably, although not necessarily, state metric array 32 and flag array 36 are implemented using random access memory(RAM)/registers, and trellis data structures 34 and program memory 38 are implemented using read only memory (ROM). Of course, virtually any suitable type of memory may be employed.

The state metric array 32 stores the metric values accumulated for each state being processed by the Viterbi algorithm. Flag array 36 is a secondary array that corresponds to the state metric array 32 and stores a flag for each state transition that is part of a viable survivor path through the trellis/state transition diagram. Program memory 38 stores the appropriate data processing instructions for implementing the present invention as will be described in more detail below. Trellis data structures 34 store trellis "lookup" tables employed in conventional Viterbi decoders including a forward path lookup table, a backward path lookup table, etc. The pointer array stores the survivor branch (i.e., points to the parent) for each states and every time stage.

The demodulator/equalizer 20 operates on any logical "block" of data such as a time slot, a frame, a subframe, a packet, or other unit of information transferred. Assume for example in a time division multiple access (TDMA) context that each time slot contains one hundred and sixty symbols. In other words, one hundred sixty symbols of raw data are serially transmitted to the channel tracker 22 in each logical block. Each block of one hundred sixty symbols is processed before a next block of one hundred sixty symbols is processed.

The trellis data structure memory 34 stores a trellis configuration based on the type of modulation/encoding used by the transmitter, with each trellis time interval or stage corresponding to one symbol in the block. In North American TDMA cellular communications for example, the trellis data structures are modelled based upon a π/4-DQPSK type of modulation technique. The stored trellis data structures indicate the many different permissible state transition paths through the trellis. Of course, different communication techniques or combinations of techniques result in different trellis data structures.

Figure 4:
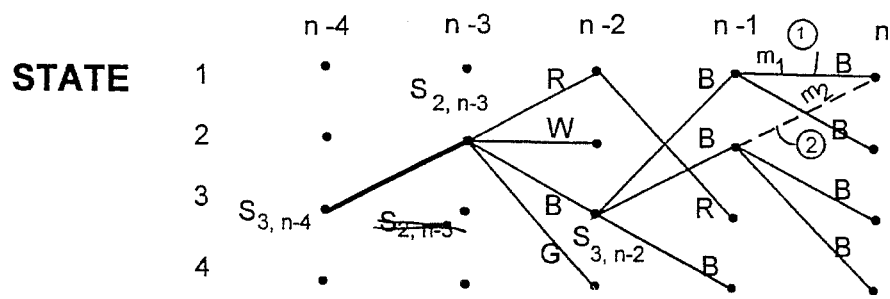
FIG. 4 is an exemplary trellis diagram for illustrating the present invention.

Reference is now made to FIG. 4 which illustrates an exemplary trellis diagram for describing the present invention. To simplify the description, only the survivor paths are generally shown. There are four possible states (1–4) each state corresponding for example in π/4-DQPSK modulation schemes to two binary bits 00, 01, 10, and 11. While only exemplary time intervals (or stages) n-4, n-3, n-2, n-1, and n are shown, the trellis for a 160 symbol block would have 160 time intervals (stages). Thus, for example at state 1 at time interval n, two possible paths are shown from states 1 and 2 at time interval n-1. Both branch paths have associated branch metrics $m_1$ and $m_2$. Conventional Viterbi algorithm processing carried out using the add, compare, and select steps described in the background eliminates branch 2 and selects branch 1 as the survivor because the sum of the branch metric $m_1$ added to the accumulated path metric for state 1 at time interval n-1, i.e. $S_{1,n-1}$, exceeds the sum of the branch metric $m_2$ added to the accumulated path metric for state 2 at time interval n-1, i.e., $S_{2,n-1}$. Thus, the thin solid branch lines in FIG. 4 represent only the survivor paths in the trellis diagram.

The central processor 30 uses the state metric array 32 and the path tables to perform conventional Viterbi analysis. Concurrently with conventional Viterbi algorithm processing (i.e. the add, compare, select operations performed for each state during each decision time interval), the present invention partially decodes one or more symbols as a block of data is analyzed. For example, the heavy bold line from state $S_{3,n-4}$ to state $S_{2,n-3}$ represents a convergence of survivor paths for those trellis stages of the currently analyzed block. Thus, the states on the decoded path (the heavy bold line) are called decoded states and include states $S_{3,n-4}$ and $S_{2,n-3}$ at decision times corresponding to time intervals (n-4) and (n-3).

The lighter solid lines represent survivor branch paths to states for stages which have yet to be decoded. For each survivor branch path from the last decoded state (in this case $S_{2,n-3}$), successive children states are assigned a particular, distinguishable group flag. For example, the four children successors of state $S_{2,n-3}$ may be assigned distinctive group flags red R, white W, blue B, and green G. In practice, these flags are simply one or more bits set in the flag array 36.

As shown in FIG. 4, all of the first generation children are assigned their own distinguishable group flag. The second and third generations (at times n-1 and n) of children then simply inherit their flags from their respective parent state. Thus for example, a red flag R was assigned $S_{1,n-2}$. The branch path to the subsequent grandchild of $S_{2,n-3}$ is also assigned a red flag R. States 2 and 4 at time n-2 do not have any subsequent survivor paths and therefore produce no children to inherit the white and green flags. State 3 at time n-2 has two children states 1 and 2 at time n-1 which inherit the B flag. Thus, as the Viterbi algorithm is executed to determine survivor branch paths to the various states in the trellis, the assigned flags for each state are carried through the process along with the accumulated metrics.

Notice in FIG. 4 at time n, all of the states $S_1$–$S_4$ carry the same color of flag B which indicates that the paths have converged in the past. When this flag convergence is detected by central processor 30, a partial decode operation takes place. The processor 30 stores a collection of pointers for each survivor path. Back tracing through the trellis data structures using the backward path table and pointers leads to the common ancestor state $S_{3,n-2}$, which is then decoded and newly designated in the last decoded state. Consequently, the symbol(s) corresponding to $S_{3,n-2}$ is (are) decoded and fed back to channel tracker 22 to update the channel model. While only one state is decoded in this example, two or more branches could be decoded by one back tracing operation.

Figure 5:
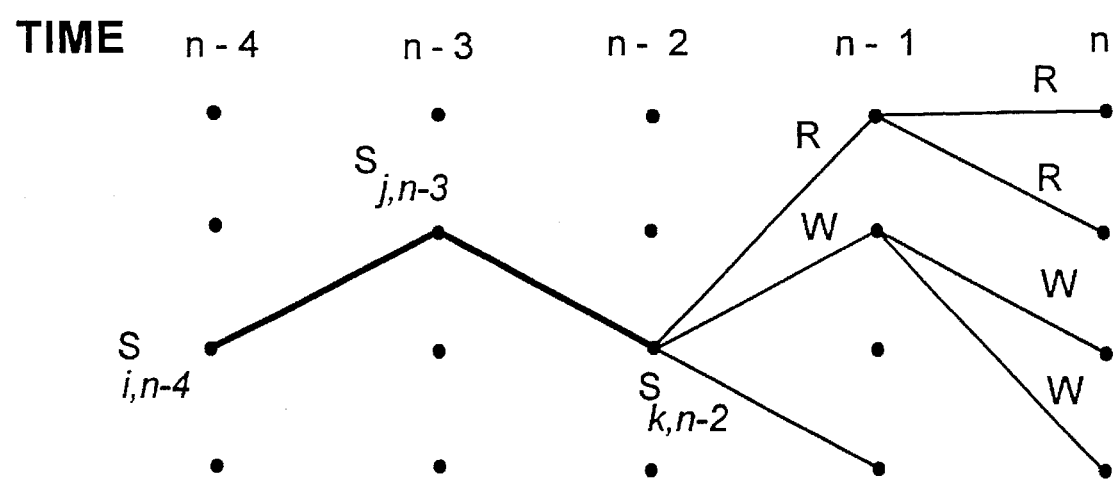
FIG. 5 is another trellis diagram further illustrating the present invention.

Once the flags are detected by processor 30 to have converged to the same flag and the information symbols for each state newly decoded, a new last decoded state is designated and group flag assignments are updated. FIG. 5 illustrates this process continuing the trellis example from FIG. 4. A new set of flags are assigned to the children of the new last decoded state. As in the example described in FIG. 4, these flags are assigned more or less arbitrarily to the first set of branch paths and are independent of previous assignments. Thus, the back tracing operation indicates both a decoded state and the exact location in the trellis where group flag reassignment is to occur.

Figure 6:
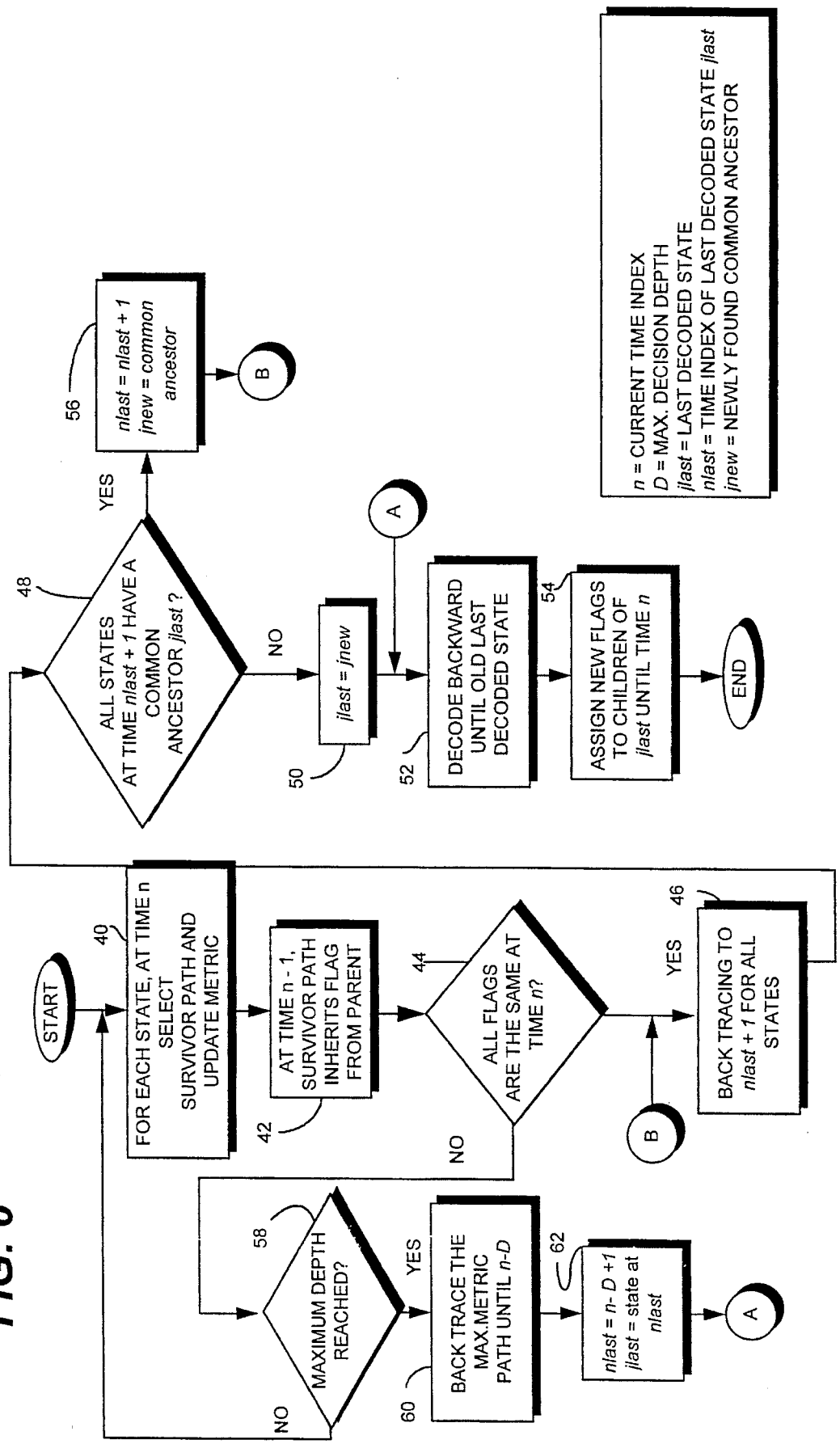
FIG. 6 is a flow chart diagram illustrating exemplary process steps for implementing a preferred embodiment of the present invention.

FIG. 6 illustrates example data processing operations executed by central processor 30, including Viterbi Algorithm with path convergence detection, in flow chart form for use in implementing (in one specific example manner) the present invention. In a preferred example embodiment, pointers in the pointer array "point" to (i.e., address) states, using the backward path table of the trellis data structures 34, to identify the predecessor of each state at any decision time interval. This backward pointing technique permits tracing of survivor paths without having to store each survivor path in the trellis.

For each state at time n, a survivor path is selected and its corresponding path metric updated (step 40) in accordance with the add, compare, select steps of the conventional Viterbi algorithm. At step 42, the survivor path "inherits" from the predecessor state at time (n-1) a group flag stored in the flag array 36. A decision is made in step 44 whether all of the flags for each state at time n are the same indicating survivor paths have merged some time in the past. If so, back tracing is performed to the time interval of the last decoded state plus one (i.e., time interval nlast+1) (step 46). In FIG. 4, jlast is $S_{2,n-3}$32 2 and nlast=n-3. If all of the states at time (nlast+1) are determined to have a common ancestor in step 48, e.g., state 3 at decision time (n-2) in FIG. 4, the time interval nlast is incremented by 1 and control returns to step 46 to repeat backtracing to the incremented time interval. This step therefore detects the time when survivor paths start diverging. If all of the states do not have a common ancestor at time (nlast+1), the last decoded state (jlast) is set as the newly found common ancestor (jnew) (step 50). For example in FIG. 4, (nlast)is now (n-2) and (jlast)=3. Backward decoding is executed until the previous last decoded state is identified in step 52. New flags are assigned to the children of the last decoded state until time interval n. Therefore, the branch connecting states $S_{2,n-3}$ and $S_{3,n-2}$ is now decided.

Returning to decision block 44, if all flags are not the same, a decision is made in block 58 whether the maximum Viterbi decision depth D has been reached. If it has not, control returns to step 40 for continued Viterbi algorithm processing. However, if the maximum depth has been reached, backtracing is performed along the maximum metric path until decision time (n-D) (step 60). The time index of the last decoded state (nlast) is then calculated in accordance with the following equation: nlast=n−D+1, and the last decoded state jlast is set to the state at the time index of nlast (step 62). Control then proceeds in accordance with step 52.

By using backtracing techniques, the present invention can examine and update group flags along with performing partial decodes. Because back tracing involves simply a table lookup operation from the trellis data structures as compared to more time consuming data processing operations such as addition or multiplication the present invention performs Viterbi decoding with added efficiency. This more efficient back tracing procedure is particularly effective when decoding noisy channels where the survivor paths remain diverse for a longer period of time. The present invention is also advantageous in that when survivor paths merge quickly, a shorter decision delay is employed which is useful for channel tracking. A shorter decision delay than D occurs whenever all group flags are the same, i.e., the decision at block 44 is "yes". After the iteration of blocks 46, 48, and 56, the value of (n-nlast) (the decision delay) is always less than D, which happens frequently when the channel condition is favorable or when there are only a few errors.

In situations where sufficient memory is available but the computing resources are limited, an alternative embodiment for updating the group flags is now described. Referring again to FIG. 4, when a path convergence is detected at time n, the flags are checked at time n-1, n-2, until time interval (nlast). The first incidence where only a single branch carries the blue flag B (in this case the state transition connecting state $S_{2,n-3}$ and $S_{3,n-2}$) indicates that a common ancestor has been found such that in this example the new (nlast) equals (n-2) and (jlast) equals $S_{k,n-2}$. Thereafter, the entire flag array 36 is updated at time n which involves node data computation. This procedure avoids backtracings for all states. However, the flag array 36 must store flags for all times within the maximum decision depth rather than just keeping a running flag array updated along with the accumulated metric.

While the present invention has particular applicability to radio telephone communications, and in particular to feedback type demodulator/equalizers, the present invention can be applied to any information decoding application over any type of digital communications channel. Thus, while the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of processing units of received information, each unit of received information being processed to produce an estimated sequence of symbols, comprising:

considering each unit of received information as a series of possible state transitions over successive time intervals;

selecting a plurality of survivor paths connecting certain states in successive time intervals, each of the selected paths representing one possible sequence estimate corresponding to the unit of received information; and decoding one or more of the states at a particular time interval along one of the selected paths based on an analysis of state transitions for a variable number of successive time intervals, wherein the variable number of successive time intervals varies during processing of the unit of received information to produce a maximum-likelihood sequence estimate of a transmitted original symbol sequence corresponding to the unit of received information.

2. The method according to claim 1, wherein the variable number varies in accordance with a minimal number of time intervals required for all survivor paths to converge with respect to the one or more decoded states.

3. The method according to claim 1, further comprising:

identifying a most recently decoded state at a time interval preceding a current time interval;

assigning a corresponding different flag to each successor state from the most recently decoded state at the next time interval following the most recently decoded state;

assigning thereafter to any subsequent states from each of the successor states the same flag assigned to the successor state; and detecting when assigned flags for all surviving states in one time interval are identical.

4. The method according to claim 3, further comprising:

backtracing along survivor paths from where the assigned flags for all states are the same to where all of the backtraced survivor paths converge to a single state, wherein the decoding step decodes one or more states at a time interval that precedes a time interval where all of the backtraced survivor paths converge.

5. A method of processing a received symbol sequence transmitted from a transmitter, the transmitted symbol sequence corresponding to a selected path through a trellis having a plurality of stages corresponding to successive time intervals, there being a plurality of possible states at each stage, wherein various possible paths through the trellis are analyzed to select a plurality of survivor paths through the trellis as candidates of the transmitted symbol sequence comprising the steps of:

(a) identifying a current decoded state in one stage of the trellis;

(b) initially assigning a different group flag to children states in a next succeeding stage connected by one of the survivor paths to the decoded state;

(c) further assigning to children states of each parent state in stages following the next succeeding stage a same group flag assigned to the parent state;

(d) detecting when group flags of all children states in one of the following stages are identical; and (e) decoding the parent state initially assigned the group flag detected in the detecting step.

6. The method of claim 5, wherein step (e) includes decoding descendant states from the decoded parent state.

7. The method of claim 5, wherein step (a) also includes identifying an initial state at the start of the trellis.

8. The method of claim 5, wherein step (a) also includes randomly selecting an initial state at the start of the trellis.

9. The method of claim 5, wherein after the detecting step (d) the method further comprises:

back tracing through preceding stages in the trellis to detect one of the parent states to be decoded in the decoding step.

10. The method of claim 9, wherein the back tracing occurs for a variable number of preceding stages up to a predetermined maximum number.

11. The method of claim 9, further comprising after the decoding step:

designating a last decoded parent state as a new current decoded state;

reassigning a new set of groups flags to children states in a next succeeding stage connected by one of the survivor paths to the new current decoded state; and repeating steps (c)–(e).

12. A sequence estimator comprising:

a receiver for receiving blocks of data over a communications channel;

a memory for storing a trellis matrix constructed as a series of columns of plural states with successive columns representing successive time intervals and each row representing one possible state; and a processor using the trellis matrix to estimate a sequence of symbols corresponding to the one block of received data, each symbol estimate being decided using a variable number of columns in the trellis matrix, wherein the processor varies the number of columns in the trellis matrix to adapt to changes in a condition of the communications channel such that fewer columns are used to decide a symbol estimate when the condition of the communications channel if favorable and more columns are used to decide a symbol estimate when the condition of the communications channel is less favorable to thereby produce a maximum likelihood sequence estimate of a transmitted original symbol sequence corresponding to the one block of received data.

13. In a communications system including a receiver for receiving a symbol sequence transmitted by a transmitter over a communications channel, the transmitted symbol sequence corresponding to a selected path through a trellis having a plurality of stages corresponding to successive time intervals, there being a plurality of possible states at each stage, wherein various possible paths through the trellis are analyzed to select a plurality of survivor paths through the trellis as candidates of the transmitted symbol sequence, comprising:

a channel tracker for predicting characteristics of the communications channel and compensating the received signal sequence based on the predicted communication channel characteristics; and a sequence estimator for detecting a stage where survivor paths converge to one state and for decoding a symbol in the symbol sequence corresponding to the one state, wherein the decoded symbol is used by the channel tracker to update the predicted channel characteristics of the communications channel.

14. The apparatus in claim 13, wherein the sequence estimator decodes the symbol based on a variable number of stages up to a predetermined maximum number.

15. The apparatus in claim 13, wherein the sequence estimator includes:

means for identifying a current decoded state in one stage of the trellis;

means for initially assigning a different group flag to states in a next succeeding stage connected by one of the survivor paths to the decoded state;

means for further assigning to children states of each parent state in stages following the next succeeding stage a same group flag assigned to the parent state;

means for detecting when group flags of all children states in one of the following stages are identical; and means for decoding the parent state initially assigned the group flag.

16. The apparatus in claim 15, further comprising:

means for designating the decoded parent state as a new current decoded state, and means for reassigning a new set of groups flags to states in a next succeeding stage connected by survivor paths to the new current decoded state.

* * * * *